US010147377B2

(12) United States Patent
Abe et al.

(10) Patent No.: US 10,147,377 B2
(45) Date of Patent: *Dec. 4, 2018

(54) DISPLAY DEVICE

(71) Applicant: Japan Display Inc., Tokyo (JP)

(72) Inventors: Hiroyuki Abe, Chiba (JP); Masahiro Maki, Mobara (JP); Hiroaki Komatsu, Mobara (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/808,142

(22) Filed: Nov. 9, 2017

(65) Prior Publication Data
US 2018/0068631 A1 Mar. 8, 2018

Related U.S. Application Data

(63) Continuation of application No. 15/290,009, filed on Oct. 11, 2016, now Pat. No. 9,842,558, which is a (Continued)

(30) Foreign Application Priority Data

Jun. 1, 2011 (JP) .................................. 2011-123747

(51) Int. Cl.
*G09G 3/36* (2006.01)
*G09G 3/20* (2006.01)
*G11C 19/28* (2006.01)

(52) U.S. Cl.
CPC ............. *G09G 3/3677* (2013.01); *G09G 3/20* (2013.01); *G09G 3/2018* (2013.01);
(Continued)

(58) Field of Classification Search
None
See application file for complete search history.

(56) References Cited

U.S. PATENT DOCUMENTS 5,859,630 A 1/1999 Huq
9,147,496 B2 * 9/2015 Abe ....................... G11C 19/28
(Continued)

FOREIGN PATENT DOCUMENTS

JP H08-55493 A 2/1996
JP 2001-176288 A 6/2001
(Continued)

OTHER PUBLICATIONS

Japanese Office Action dated Mar. 24, 2015 regarding counterpart Japanese Patent Application No. 2011-123747 with partial translation.
(Continued)

*Primary Examiner* — Dorothy Harris
(74) *Attorney, Agent, or Firm* — TYPHA IP LLC

(57) ABSTRACT

A driving circuit of a display device includes first to third output signal lines which are continuously arranged, a first transistor that has a source connected to the second output signal line and a drain connected to a first clock signal line, and a second transistor that provides a non-active potential to a gate of the first transistor when a second clock signal becomes the active potential, wherein a circuit that outputs the active potential to the first output signal line and the third output signal line is disposed at an opposite side to a circuit that outputs the active potential to the second output signal line with a display region interposed therebetween, and wherein the gate of the first transistor is connected to the first output signal line and the third output signal line via rectifying circuits.

9 Claims, 10 Drawing Sheets

Related U.S. Application Data continuation of application No. 14/825,042, filed on Aug. 12, 2015, now Pat. No. 9,489,879, which is a continuation of application No. 13/486,236, filed on Jun. 1, 2012, now Pat. No. 9,147,496.

(52) U.S. Cl.
CPC ........... *G09G 3/3674* (2013.01); *G11C 19/28* (2013.01); *G09G 2310/0281* (2013.01); *G09G 2310/0283* (2013.01); *G09G 2310/0286* (2013.01); *G09G 2310/08* (2013.01); *G09G 2330/021* (2013.01)

(56) References Cited

U.S. PATENT DOCUMENTS

| | | | | |
|---|---|---|---|---|
| 9,489,879 | B2* | 11/2016 | Abe | ........................ G11C 19/28 |
| 9,842,558 | B2* | 12/2017 | Abe | ........................ G09G 3/3677 |
| 2006/0007085 | A1 | 1/2006 | Kim et al. | |
| 2006/0262074 | A1 | 11/2006 | Shimoda | |
| 2006/0279511 | A1* | 12/2006 | Uh | ........................ G11C 19/184 |
| | | | | 345/100 |
| 2007/0001953 | A1* | 1/2007 | Jang | ..................... G09G 3/3607 |
| | | | | 345/88 |
| 2010/0158188 | A1 | 6/2010 | Lee et al. | |

FOREIGN PATENT DOCUMENTS

| | | |
|---|---|---|
| JP | 2004-185684 A | 7/2004 |
| JP | 2007-317288 A | 12/2007 |
| JP | 2008-276849 A | 11/2008 |
| JP | 2009-223051 A | 10/2009 |
| JP | 2011-027915 A | 2/2011 |
| WO | 2011/055570 A1 | 5/2011 |

OTHER PUBLICATIONS

Lin, "Diode Operation of a Transistor in Functional Blocks," IEEE Transactions in Electron Devices, 1963, pp. 189-194.

Definition "diode" downloaded Apr. 11, 2014 from http://www.thefreedictionary.com/diode.

* cited by examiner

DISPLAY DEVICE

CROSS-REFERENCE TO RELATED APPLICATIONS

This application is a continuation of U.S. patent application Ser. No. 15/290,009 filed on Oct. 11, 2016, which, in turn, is a continuation of U.S. patent application Ser. No. 14/825,042 (now U.S. Pat. No. 9,489,879) filed on Aug. 12, 2015, which, in turn, is a continuation of U.S. patent application Ser. No. 13/486,236 (now U.S. Pat. No. 9,147,496) filed on Jun. 1, 2012. Further, this application claims priority from Japanese application JP2011-123747 filed on Jun. 1, 2011, the contents of which are hereby incorporated by reference into this application.

BACKGROUND OF THE INVENTION

1. Field of the Invention

The present invention relates to a display device.

2. Description of the Related Art

Liquid crystal displays are in wide use as display devices of information communication terminals, such as a computer or a television set receiver. In addition, an organic EL display (OLED), a field emission display (FED), and the like are also known as flat panel display devices. A liquid crystal display is a device in which the alignment of a liquid crystal composition sealed between two substrates is altered by changing an electric field and thus the extent of transmission for light passing through the two substrates and the liquid crystal composition is controlled, thereby displaying images.

In a display device, including the liquid crystal display, applying a voltage corresponding to a predetermined grayscale value to each pixel of a screen, pixel transistors for applying a voltage corresponding to a grayscale value to each pixel are disposed. Generally, gates of the pixel transistors for one line of the screen are connected to a signal line (hereinafter, referred to as a "scanning signal line"), and the scanning signal line is controlled by a driving circuit so as to output an active voltage for turning on the pixel transistors sequentially line by line. In addition, there is a display device having a bidirectional scanning function capable of outputting the active voltage in both a forward direction and a backward direction so as to perform display by reversing upwards and downwards on the screen.

JP8-55493 A discloses a circuit for realizing bidirectional scanning, and switches for changing the forward direction and backward direction are provided for each line. JP2008-276849 A discloses an image display device in which a circuit for performing the forward scanning is provided at one end of each scanning signal line and a circuit for performing the backward scanning is provided at the other end thereof in order to realize the bidirectional scanning. The specification of U.S. Pat. No. 5,859,630 discloses a circuit capable of performing bidirectional scanning, disposed on one side of a display region.

SUMMARY OF THE INVENTION

In JP8-55493 A described above, two transistors are necessary for each line in order to switch the scanning directions, and, in JP2008-276849 A, driving circuits for performing scanning in the respective directions at both sides of the display region are necessary. Therefore, the scale of the circuit is inevitably increased. In addition, in the specification of U.S. Pat. No. 5,859,630, the circuit capable of performing bidirectional scanning is disposed on one side of the display region, and thus the scale of a circuit on one side is increased. In recent years, there has been demand for reduction in a bezel region which is a peripheral region of the display region, and an increase in the scale of the circuit prevents a reduction in the bezel region and causes an increase in power consumption.

The present invention has been made in consideration of the circumstances, and an object thereof is to provide a display device having a driving circuit which can perform bidirectional scanning and reduce the scale of the circuit.

According to an aspect of the present invention, there is provided a display device including a driving circuit that sequentially applies an active potential for turning on a pixel transistor to a plurality of output signal lines, wherein the driving circuit includes a first output signal line, a second output signal line, and a third output signal line that are the plurality of output signal lines and are three output signal lines which are continuously arranged; a first clock signal line to which a first clock signal which is a clock signal is applied; a second clock signal line to which a second clock signal which is a clock signal whose active potential does not temporally overlap the active potential of the first clock signal is applied; a first transistor that is a transistor of which one of the source and the drain is directly or indirectly connected to the second output signal line and the other of the source and the drain is directly or indirectly connected to the first clock signal line; and a second transistor that directly or indirectly provides a non-active potential to a gate of the first transistor when the second clock signal becomes the active potential, wherein a circuit that outputs the active potential to the first output signal line and the third output signal line is disposed at the opposite side to a circuit that outputs the active potential to the second output signal line with a display region interposed therebetween, and wherein the gate of the first transistor is directly or indirectly connected to the first output signal line and the third output signal line via rectifying circuits, respectively.

In the display device according to the aspect of the present invention, the first output signal line may output the active potential when a third clock signal which is a clock signal whose active potential does not temporally overlap the active potential of the first and second clock signals is applied thereto. In addition, the third output signal line may output the active potential when a fourth clock signal which is a clock signal whose active potential does not temporally overlap the active potential of the first to third clock signals is applied thereto. Further, when the active potential is output in order of the first output signal line, the second output signal line and the third output signal line, the first to fourth clock signals may be four-phase clocks which become the active potential in order of the first clock signal, the second clock signal, the third clock signal and the fourth clock signal, and, when the active potential is output in order of the third output signal line, the second output signal line and the first output signal line, the first to fourth clock signals may be four-phase clocks which become the active potential in order of the fourth clock signal, the third clock signal, the second clock signal and the first clock signal.

In the display device according to the aspect of the present invention, a transistor for voltage resistance whose gate is fixed to an intermediate voltage of which the absolute value is smaller than the active potential may be provided between the gate of the first transistor and either of the source and the drain of the second transistor.

In the display device according to the aspect of the present invention, a transistor for voltage decrease whose gate is fixed to an intermediate voltage of which the absolute value is smaller than the active potential may be provided between the second clock signal line and a gate of a transistor which outputs a low potential to the second output signal line during a period when the second output signal line does not output the active potential.

In the display device according to the aspect of the present invention, the first transistor and a transistor which outputs a low potential to the second output signal line during a period when the second output signal line does not output the active potential may be divided by a last stage circuit block.

DETAILED DESCRIPTION OF THE INVENTION

Figure 1:
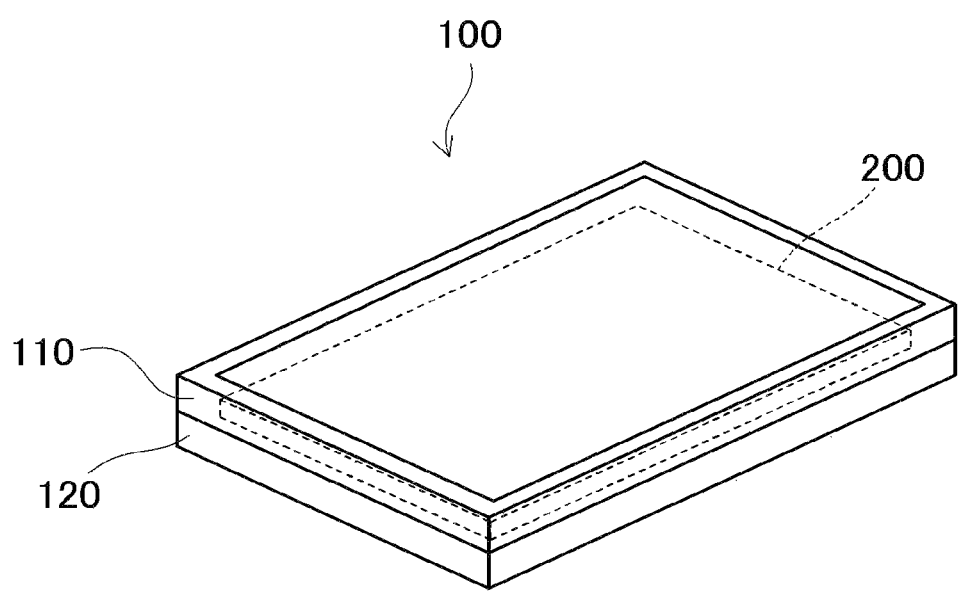
FIG. 1 is a diagram schematically illustrating a liquid crystal display according to an embodiment of the present invention.

Hereinafter, embodiments of the present invention will be described with reference to the drawings. In addition, in the drawings, the same or equivalent elements are given the same reference numerals, and repeated description will be omitted.

FIG. 1 schematically shows a liquid crystal display 100 according to an embodiment of the present invention. As shown in this figure, the liquid crystal display 100 includes an upper frame 110, a lower frame 120, a liquid crystal panel 200 fixed so as to be interposed therebetween, and a backlight device (not shown).

Figure 2:
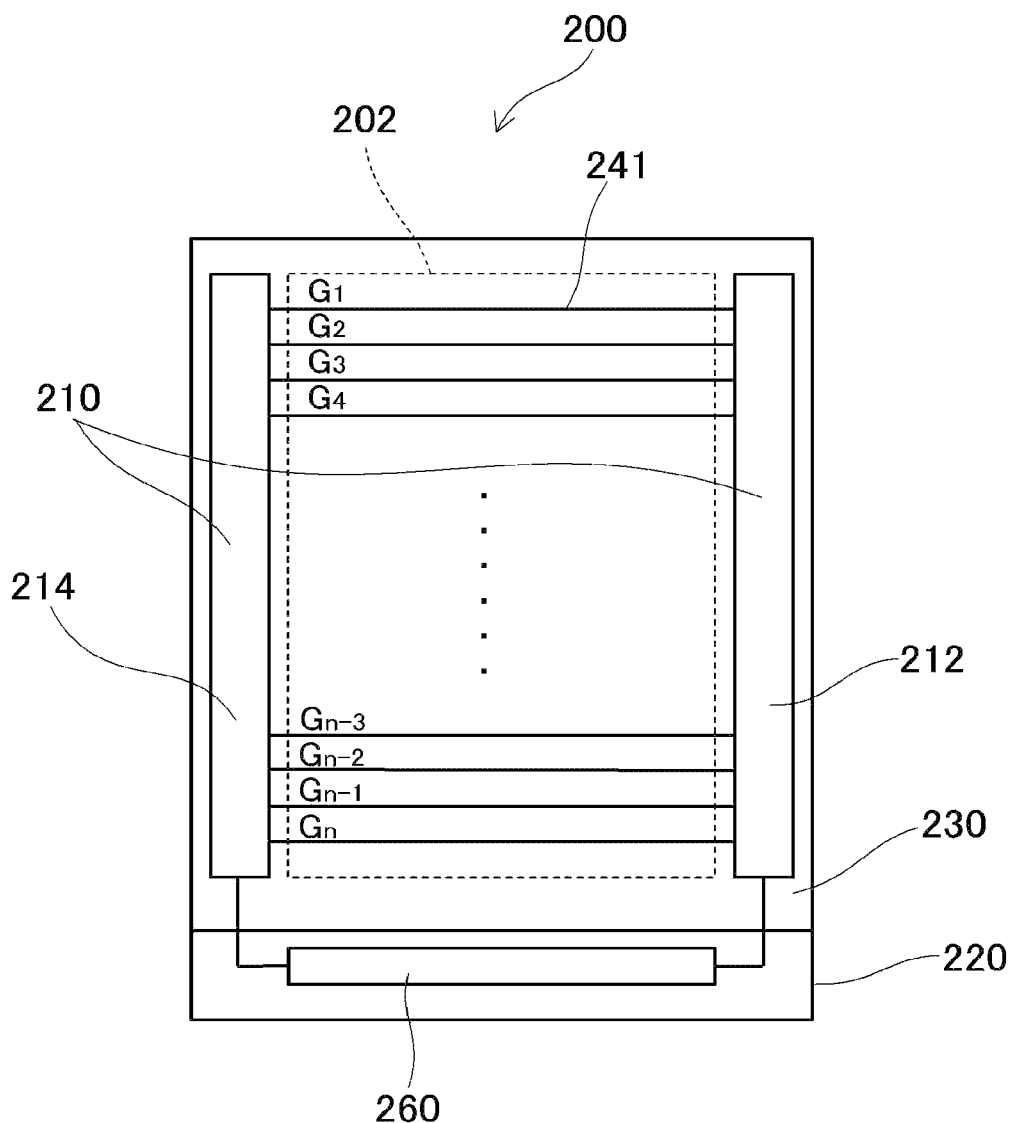
FIG. 2 is a diagram illustrating a configuration of a liquid crystal panel.

FIG. 2 shows a configuration of the liquid crystal panel 200 shown in FIG. 1. The liquid crystal panel 200 includes two substrates of a TFT (Thin Film Transistor) substrate 220 and a color filter substrate 230, and a liquid crystal composition is sealed between the substrates. The TFT substrate 220 is provided with a driving circuit 210 which sequentially applies a predetermined voltage to scanning signal lines $G_1$ to $G_n$, and a driving IC (Integrated Circuit) 260 which applies a voltage corresponding to a grayscale value of a pixel to a plurality of data signal lines (not shown) extending so as to intersect the scanning signal lines $G_1$ to $G_n$ in a pixel region 202 and controls the driving circuit 210. In addition, the driving circuit 210 includes a right driving circuit 212 located on the right side of the pixel region 202 in the figure and a left driving circuit 214 located on the left side of the pixel region.

Figure 3:
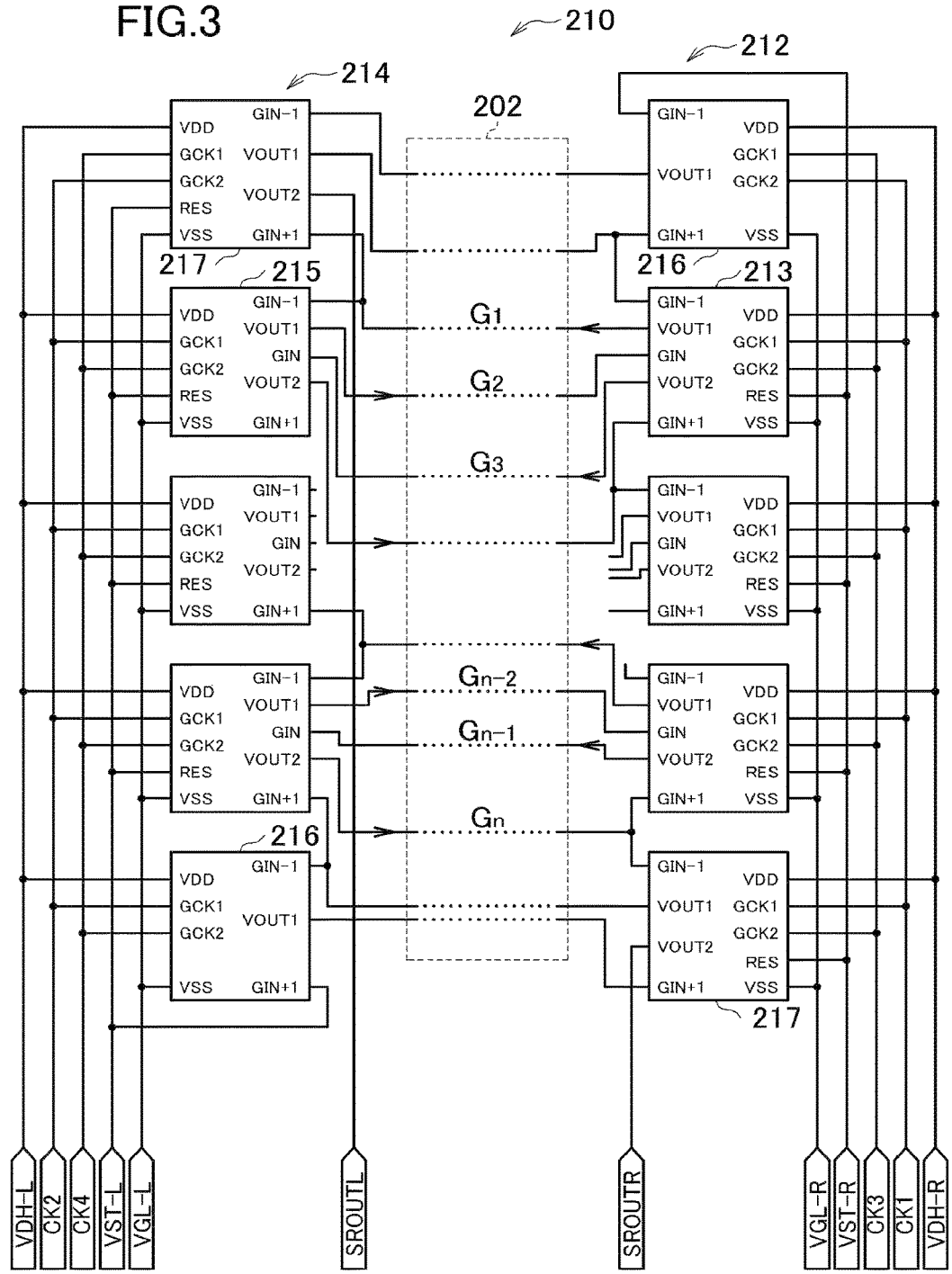
FIG. 3 is a diagram schematically illustrating a configuration of a driving circuit.

FIG. 3 is a diagram schematically illustrating a circuit configuration of the driving circuit 210. The right driving circuit 212 is a driving circuit which applies a high voltage (active voltage) for electrically connecting sources and drains of TFTs to gates of the TFTs disposed at each pixel in relation to odd-numbered scanning signal lines $G_{2i-1}$ (where i is a natural number), and the left driving circuit 214 is a driving circuit which applies a high voltage for electrically connecting sources and drains of TFTs to gates of the TFTs disposed at each pixel in relation to even-numbered scanning signal lines $G_{2i}$. Except for a start signal VST, the right driving circuit 212 performs an output using an output of the left driving circuit 214 as a trigger, and the left driving circuit 214 performs an output using an output of the right driving circuit 212 as a trigger. The right driving circuit 212 is driven by clock signals CK1 and CK3, and the left driving circuit 214 is driven by clock signals CK2 and CK4. In addition, the clock signals CK1 to CK4 are four-phase clocks which become a high voltage in order of CK1, CK2, CK3, and CK4 during forward scanning, and are four-phase clocks which become an active voltage in order of CK4, CK3, CK2 and CK1 during backward scanning.

The forward scanning starts by the right driving circuit 212 outputting a high voltage to the scanning signal line $G_1$ and finishes by the left driving circuit 214 outputting a high voltage to the scanning signal line $G_n$. The backward scanning starts by the left driving circuit 214 outputting a high voltage to the scanning signal line $G_n$ and finishes by the right driving circuit 212 outputting a high voltage to the scanning signal line $G_1$. In addition, the right driving circuit 212 includes an initial stage circuit block 216 in the initial stage, a plurality of circuit blocks 213 outputting a high voltage to the odd-numbered scanning signal lines $G_{2i-1}$, and a last stage circuit block 217 in the last stage. The circuit blocks 213 receive signals of three consecutive even-numbered scanning signal lines $G_{2i-2}$, $G_{2i}$ and $G_{2i+2}$, and output signals of two consecutive odd-numbered scanning signal lines $G_{2i-1}$ and $G_{2i+1}$. The left driving circuit 214 includes an initial stage circuit block 216 in the initial stage, a plurality of circuit blocks 215 outputting a high voltage to the even-numbered scanning signal lines $G_{2i}$, and a last stage circuit block 217 in the last stage. The circuit blocks 215 receive signals of three consecutive odd-numbered scanning signal lines $G_{2i-1}$, $G_{2i+1}$ and $G_{2i+3}$, and output signals of two consecutive even-numbered scanning signal lines $G_{2i}$ and $G_{2i+2}$.

Figure 4:
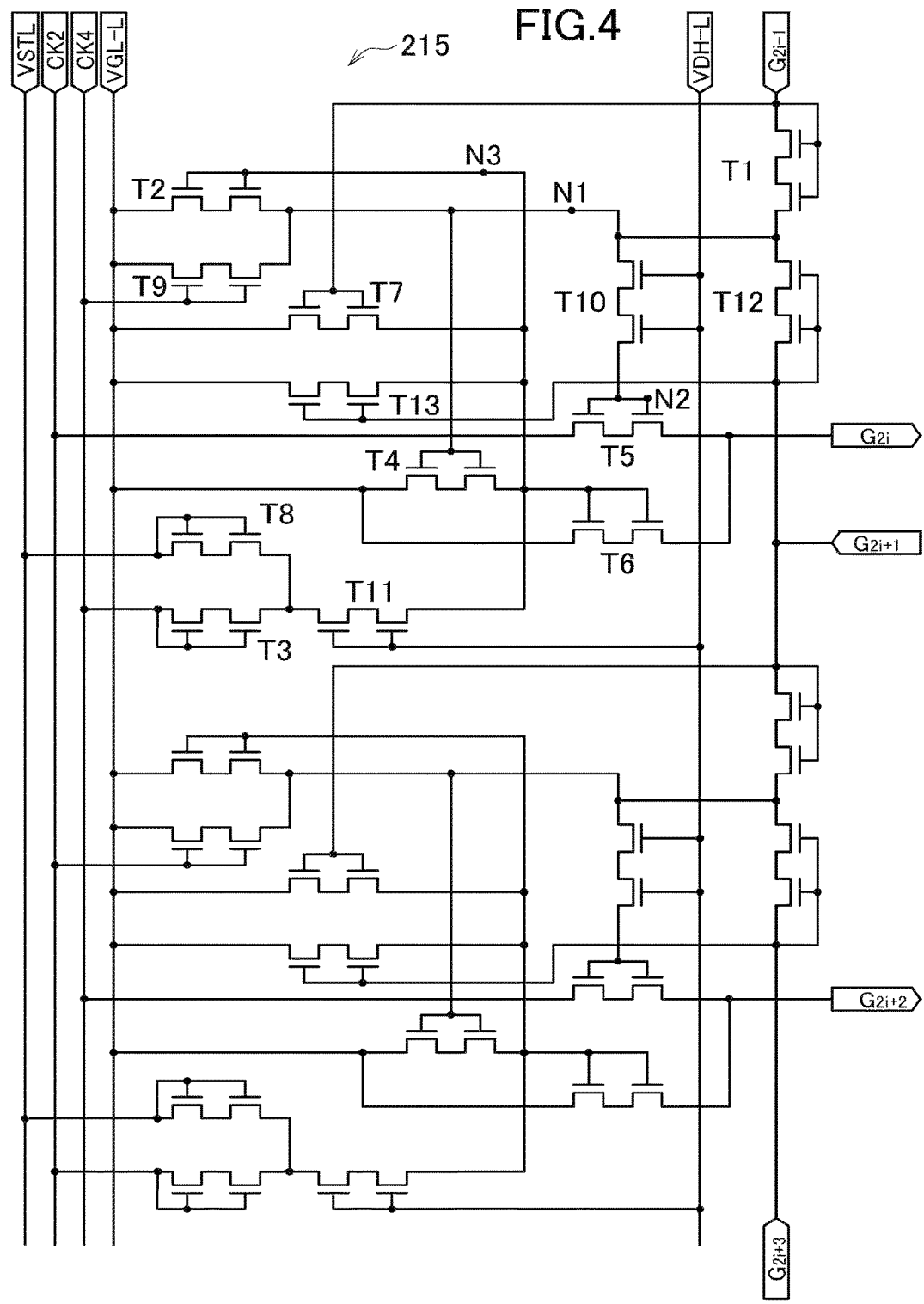
FIG. 4 is a detailed diagram illustrating a circuit configuration of a circuit block of a left driving circuit.

FIG. 4 shows a circuit configuration of the circuit block 215 of the left driving circuit 214 in detail. Here, the names of the terminals shown in FIG. 4 are changed not to the names of the terminals of the circuit block 215 in FIG. 3 but to the names of the external terminals of the driving circuit 210 in FIG. 3 in order to make a description with reference to the timing chart of FIG. 7 described later. As shown in FIG. 4, the circuit block 215 is a circuit operated by two clocks CK2 and CK4, and shows two portions outputting a high voltage to two scanning signal lines $G_{2i}$ and $G_{2i+2}$. In addition, the letter T denotes a transistor, and the letter N denotes a node. Further, each transistor is made of LTPS (Low Temperature Poly Silicon).

As shown in this figure, the circuit for outputting a high voltage to the scanning signal line $G_{2i}$ includes a diode transistor T1 which is a rectifying circuit input during forward scanning, a transistor T2 which fixes a gate electrode of a transistor T5 described later to a voltage VGL, a transistor T3 which charges a storage node N3, a storage node reset transistor T4, the transistor T5 which outputs a high voltage to the gate line, a transistor T6 which fixes the gate line to the voltage VGL using the storage node, a transistor T7 which resets the storage node using an input signal during the forward scanning, an initial reset transistor T8, a transistor T9 for resetting the gate electrode of the transistor T5, a voltage mitigation transistor T10 which restricts a voltage increased by the transistor T5 to an intermediate voltage VDH, a transistor T11 which decreases a voltage charged by the transistor T3 to the intermediate voltage VDH, a diode transistor T12 which is a rectifying circuit input during backward scanning, and a transistor T13 which resets the storage node using an input signal during the backward scanning. In addition, the intermediate voltage VDH turns on the transistor, but is lower than the gate line high voltage VGH. In the drawings, the intermediate voltage VDH and the voltage VGL are suffixed with letter "L". The letter L denotes belonging to left driving circuit 214.

Figure 5:
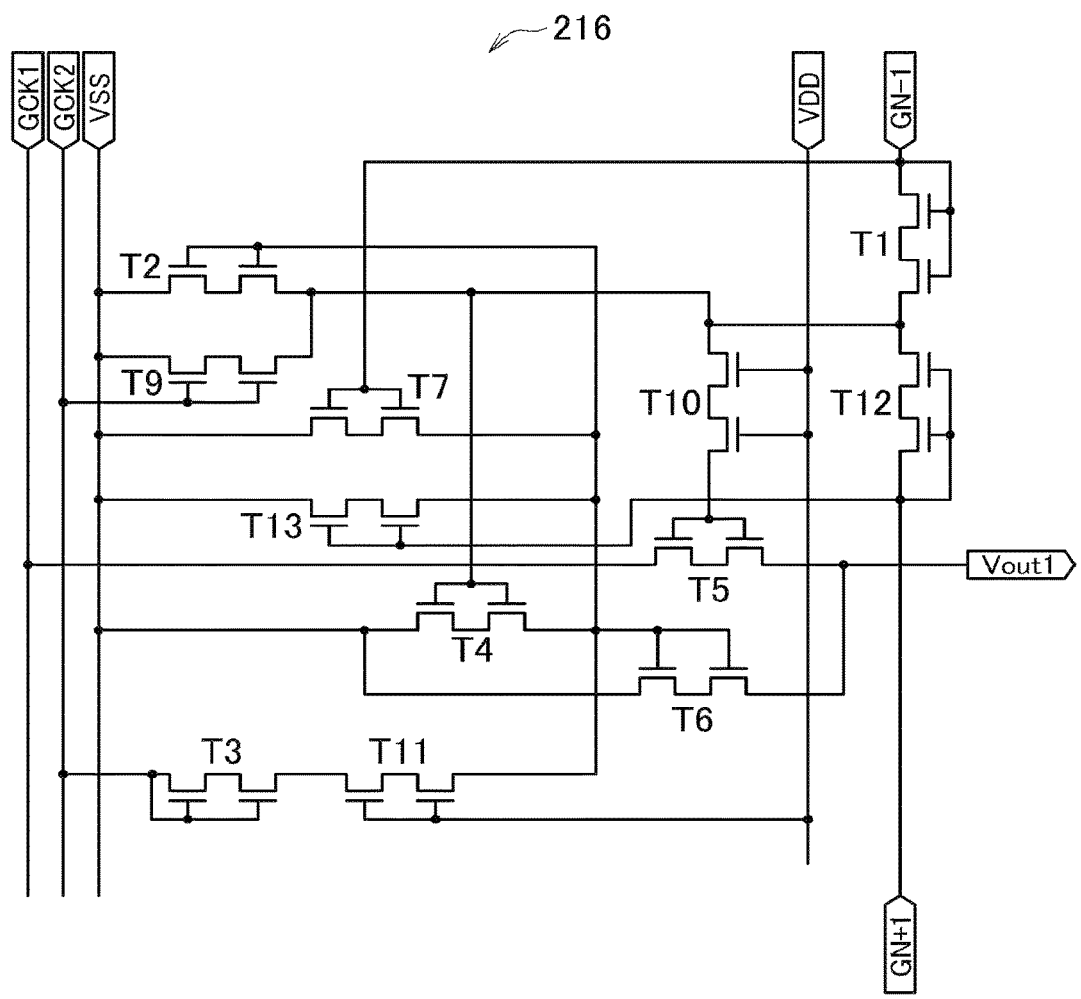
FIG. 5 is a diagram illustrating a circuit configuration of an initial stage circuit block which is an initial stage of the circuit.

FIG. 5 shows a circuit configuration of the initial stage circuit block 216 which is an initial stage of the circuit. The initial stage circuit block 216 has a configuration where the initial reset transistor T8 is not provided as compared with the circuit block 215.

Figure 6:
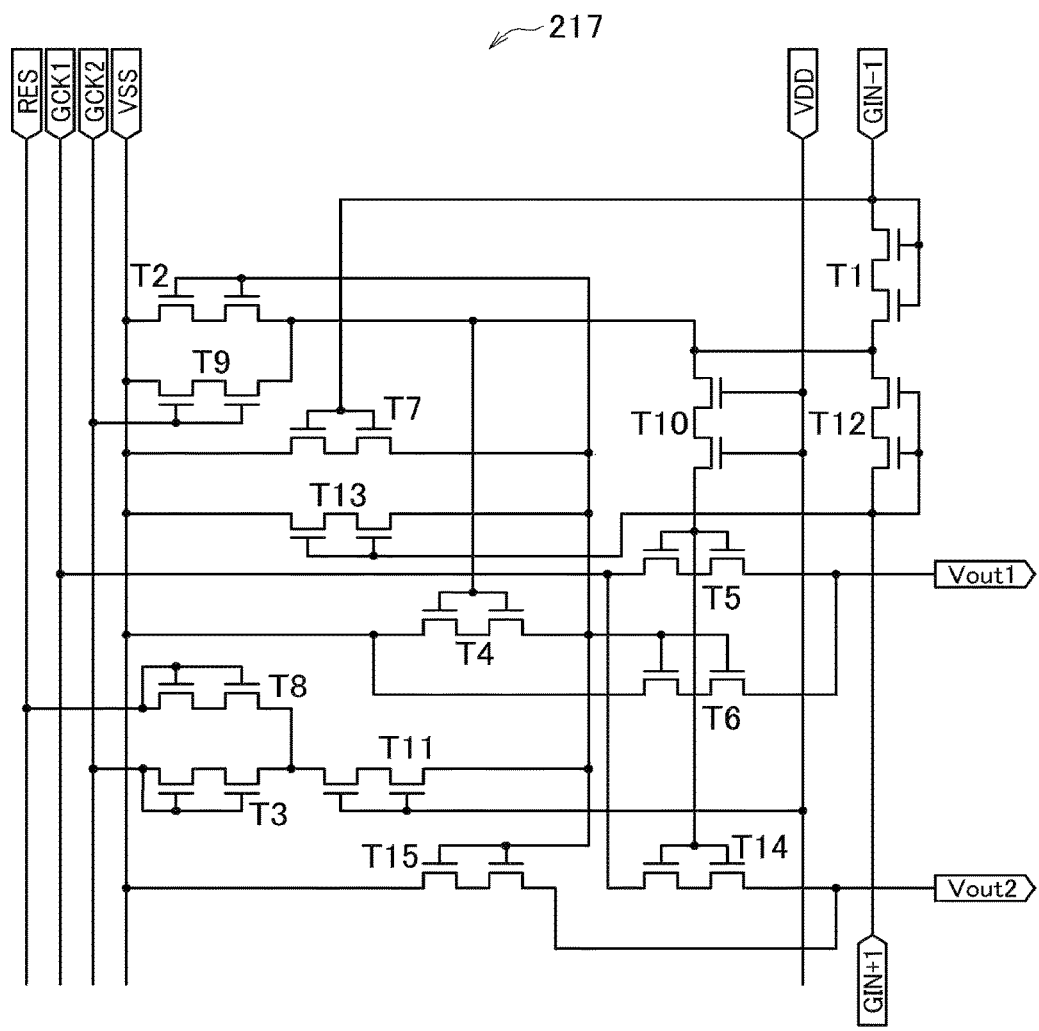
FIG. 6 is a diagram illustrating a circuit configuration of a last stage circuit block which is a last stage of the circuit.

FIG. 6 shows a circuit configuration of the last stage circuit block 217 which is a last stage. The last stage circuit block 217 has a configuration where transistors T14 and T15 connected to inspection terminals are further provided as compared with the circuit block 215.

Figure 7:
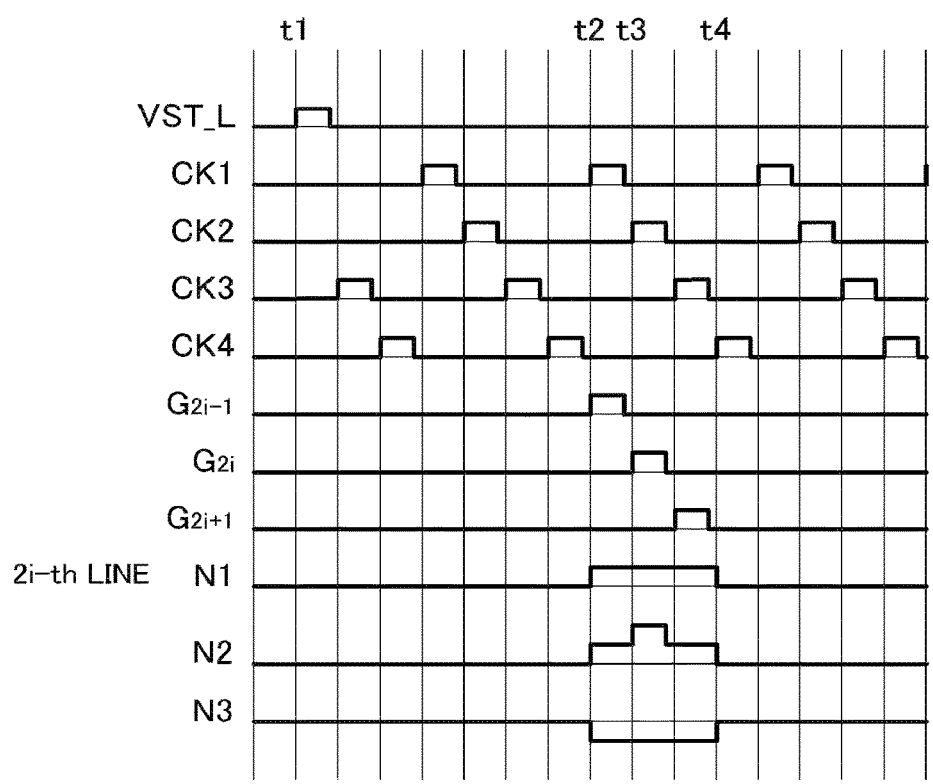
FIG. 7 is a diagram illustrating an operation timing chart when a circuit of the circuit block shown in FIG. 4 performs forward scanning.

In addition, FIG. 7 shows a timing chart of an operation of the circuit for one stage of the circuit block 215 in FIG. 4 for outputting a high voltage to the scanning signal line $G_{2i}$. Hereinafter, an operation of the circuit in FIG. 4 will be described with reference to the timing chart of FIG. 7.

First, in the circuit block 215, at the timing t1, the high voltage of the start signal VST_L is input to the left driving circuit 214 so as to set the voltage of the storage node N3 to be high as a reset operation. Next, at the timing t2, when the high voltage of the scanning signal line $G_{2i-1}$ is input, the transistor T7 is first turned on, in turn a low voltage VGL_L is applied to the node N3 such that the node N3 becomes the low voltage, the transistor T1 is turned on, and the node N1 becomes a high voltage and is maintained thereat. Therefore, the node N2 becomes a high voltage via the transistor T10 of which the gate is supplied with the intermediate voltage VDH, and thus the transistor T5 is turned on.

Next, at the timing t3, when the clock signal CK2 becomes a high voltage, the voltage of the node N2 which is the gate of the transistor T5 is further increased due to a so-called bootstrap effect, a high signal is output to the scanning signal line $G_{2i}$, and then a low signal is output thereto following an operation of the clock signal CK2.

Next, at the timing t4, when the clock signal CK4 becomes high, the transistor T3 is turned on, the node N3 rises to a high level, and the transistor T9 is turned on. Therefore, the node N1 falls to a low level. The node N1 makes the node N2 fall to a low level via the transistor T10 so as to decrease the voltage between the source and the drain of the transistor T2, and the transistor T6 is turned on by the high voltage of the node N3. Therefore, the scanning signal line $G_{2i}$ is supplied with a low voltage VGL_L and is thus fixed to the low voltage.

Here, the transistor T10 has high voltage resistance as a double-gate configuration formed by overlapping two transistors so as to resist the increased voltage due to the clock signal CK2 becoming high. The high signal output to the scanning signal line $G_{2i}$ is an input signal of the circuit block 213 of the right driving circuit 212, which outputs a high signal to the scanning signal line $G_{2i+1}$ through an operation equivalent to the above-described operation.

Figure 8:
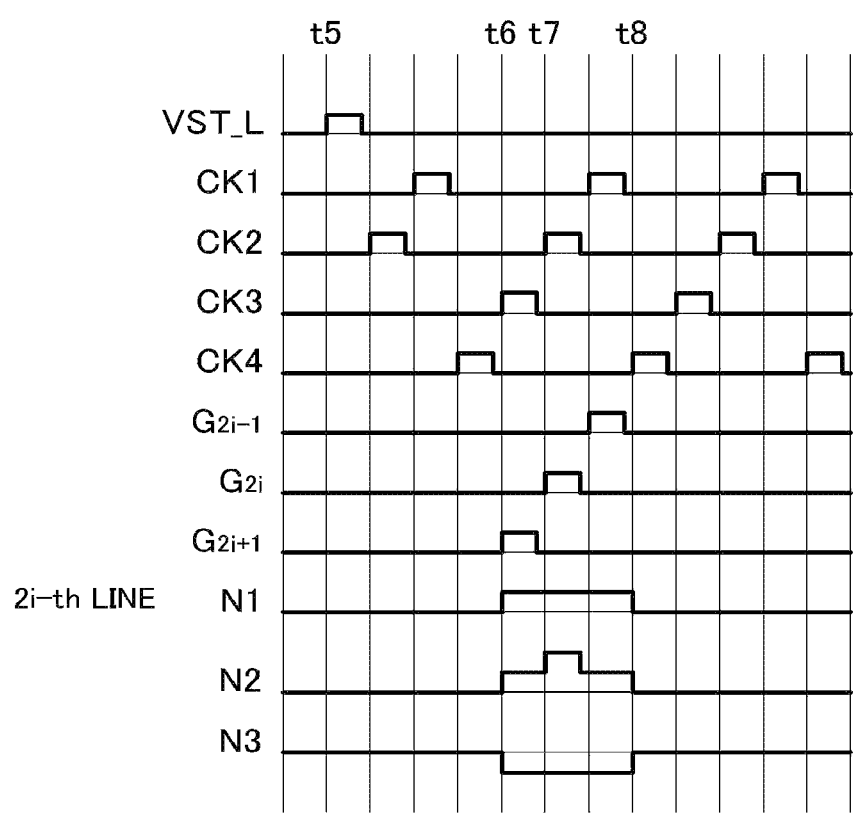
FIG. 8 is a diagram illustrating an operation timing chart when a circuit of the circuit block shown in FIG. 4 performs backward scanning.

FIG. 8 shows a timing chart when the circuit block 215 performs the backward scanning from the scanning signal line $G_n$ to the scanning signal line $G_1$. Except that the phases of the clock signals CK1 to CK4 differ and become high in reverse order, the timing chart during backward scanning is also the same as that during forward scanning. Hereinafter, an operation of the circuit in FIG. 4 will be described with reference to the timing chart of FIG. 8.

First, in the circuit block 215, at the timing t5, a high voltage of the start signal VST_L is input to the left driving circuit 214 so as to set the voltage of the storage node N3 to be high as a reset operation. Next, at the timing t6, when the high voltage of the scanning signal line $G_{2i+1}$ is input, the transistor T13 is first turned on, a low voltage VGL_L is applied to the node N3 such that the node N3 becomes the low voltage, in turn the transistor T12 is turned on, and the node N1 becomes a high voltage and is maintained thereat. Therefore, the node N2 becomes a high voltage via the transistor T10 of which the gate is supplied with the intermediate voltage VDH, and thus the transistor T5 is turned on.

Next, at the timing t7, when the clock signal CK2 becomes a high voltage, the voltage of the node N2 which is the gate of the transistor T5 is further increased due to a so-called bootstrap effect, a high signal is output to the scanning signal line $G_{2i}$, and then a low signal is output thereto following an operation of the clock signal CK2.

Next, at the timing t8, when the clock signal CK4 becomes high, the transistor T3 is turned on, the node N3 rises to a high level, and the transistor T9 is turned on. Therefore, the node N1 falls to a low level. The node N1 makes the node N2 fall to a low level via the transistor T10 so as to decrease a voltage between the source and the drain of the transistor T2, and the transistor T6 is turned on by the high voltage of the node N3. Therefore, the scanning signal line $G_{2i}$ is supplied with a low voltage VGL_L and is thus fixed to the low voltage.

As described above, since, in the embodiment of the present invention, the driving circuit applying a high signal to the odd-numbered scanning signal lines and the driving circuit applying a high signal to the even-numbered scanning signal lines are disposed with the pixel region interposed therebetween, the scale of the circuit can be reduced to a half of the case where the driving circuit is disposed on one side of the pixel region, and thus the bezel region of the display device can be reduced.

In addition, since the circuit performing the forward scanning and the circuit performing the backward scanning use the same circuit, a circuit performing the backward scanning is not required to be disposed, and thus it is possible to reduce the scale of the circuit and to thereby reduce the bezel region of the display device.

In addition, since the circuit block has the double-gate configuration formed by overlapping transistors, a high voltage resistance circuit can be formed even using LTPS.

Figure 9:
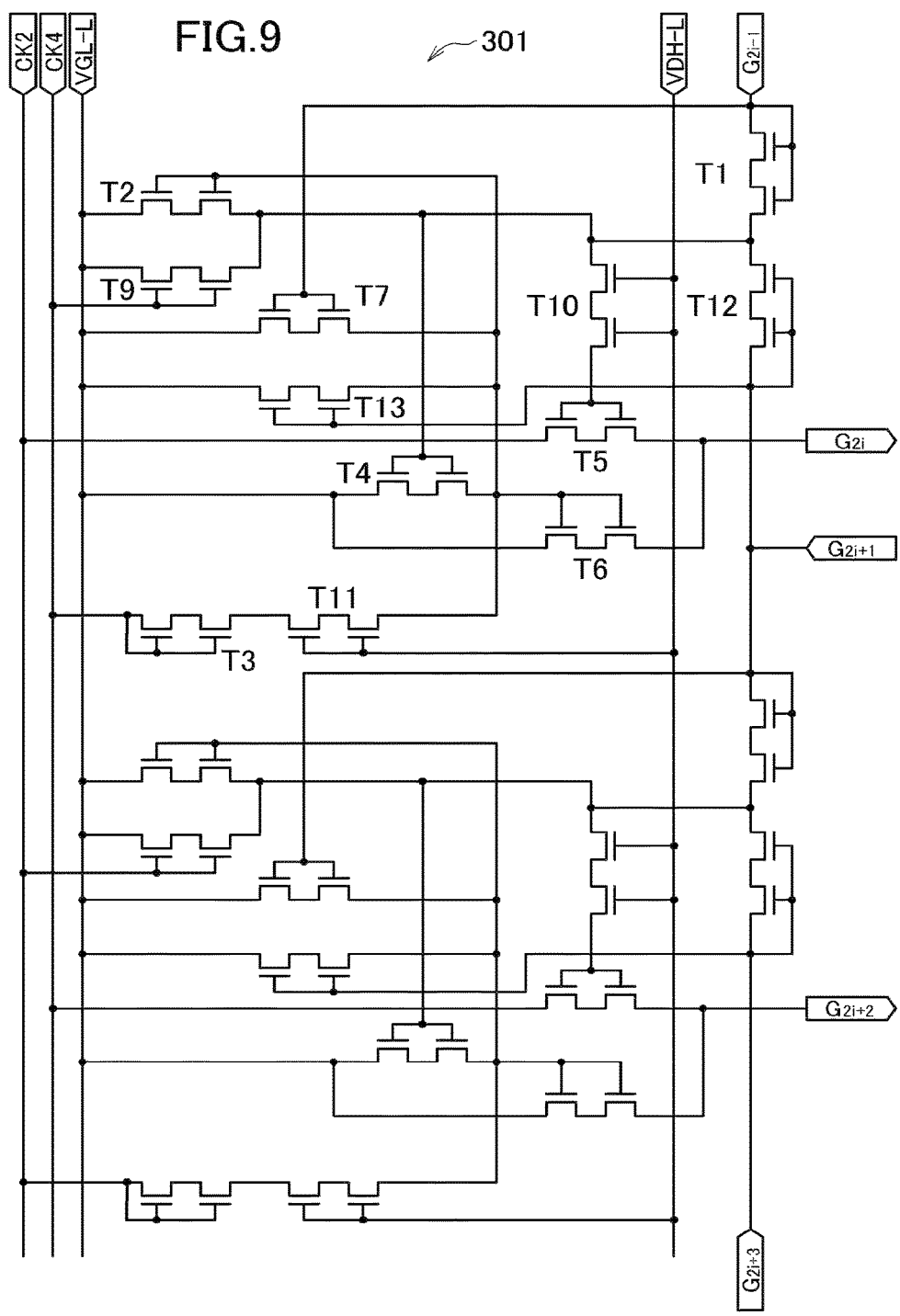
FIG. 9 is a diagram illustrating a circuit block which is a modified example of the circuit block of the left driving circuit.

FIG. 9 shows a circuit block 301 which is a modified example of the circuit block 215 of the left driving circuit 214 according to the above-described embodiment. A difference from the circuit block 215 is that the transistor T8 is not provided, and the transistor T8 is provided for charging the storage node N3 using the start signal VST_L in the above-described embodiment. However, since all the clock signals CK1 to CK4 become a high voltage and thereby the storage node N3 can be charged, it is possible to further reduce the scale of the circuit with the configuration where the transistor T8 is not provided.

Figure 10:
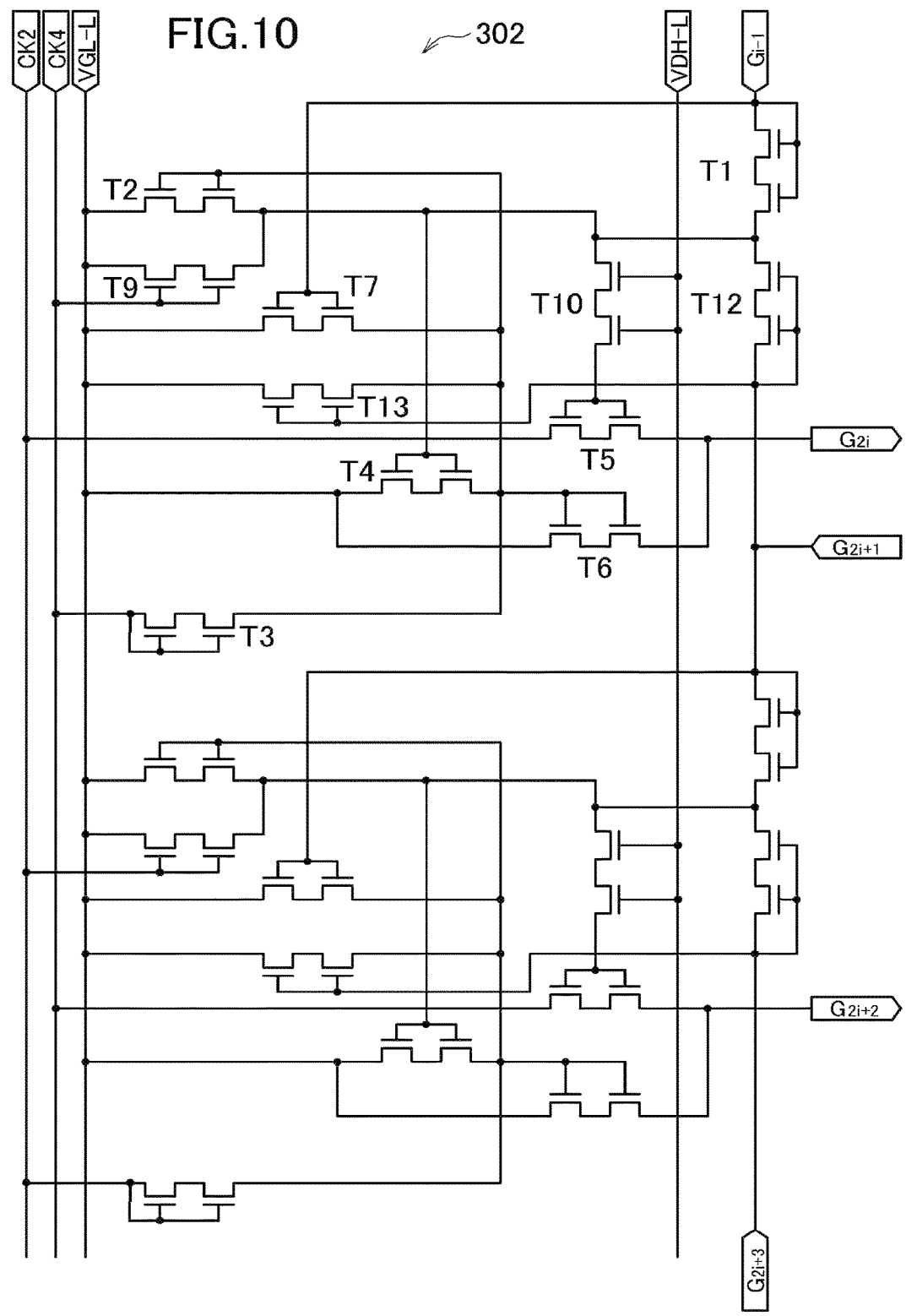
FIG. 10 is a diagram illustrating a circuit block which is a modified example of the circuit block of the left driving circuit.

FIG. 10 shows a circuit block 302 which is a modified example of the circuit block 215 of the left driving circuit 214 according to the above-described embodiment. A difference from the circuit block 215 is that the transistor T11 is not provided, and the transistor T11 is disposed such that the high voltage of the clock signal CK4 is not directly applied to the gates of the transistors T2 and T6. However, in a case where a manufacturing line is suppressed from being contaminated with Na, it is possible to further reduce the scale of the circuit with the configuration where the transistor T11 is not provided.

In addition, although the above-described embodiment uses an NMOS type transistor whose source and drain are electrically connected to each other by inputting a high voltage to a gate thereof as an active voltage, a PMOS type transistor whose source and drain are electrically connected to each other by inputting a low voltage to the gate thereof as an active voltage may be used.

Further, although, in the above-described embodiment, the clock signals use four kinds of four-phase clocks, other two or more kinds of clock signals may be used.

The liquid crystal display according to the respective embodiments may be applied to liquid crystal displays of any type of an IPS (In-Plane Switching) type, a VA (Vertically Aligned) type, and a TN (Twisted Nematic) type. In addition, the present invention is not limited to the liquid crystal display, and may be applied to an organic EL display, a field emission display (FED), and other display devices using the driving circuit.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A display device comprising:
    a plurality of pixels including a pixel transistor respectively,
    a plurality of scanning signal lines supplying a scanning signal to the plurality of pixels respectively,
    a driving circuit sequentially applying the scanning signal to the plurality of scanning lines, and
    four clock signal lines including a first clock signal line, a second clock signal line, a third clock signal line and a fourth clock signal line,
    wherein the scanning signal has an active potential which is able to turn on a pixel transistor, and a non-active potential which is able to turn off the pixel transistor,
    wherein the plurality of scanning signal lines are arranged in order of a first scanning signal line, a second scanning signal line and a third scanning signal line,
    wherein the driving circuit comprises a first output circuit configured to output the active potential to the first scanning signal line,
    wherein four clock signal lines become the active potential in order of the first clock signal line, the second clock signal line, the third clock signal line and the fourth clock signal line,
    wherein the first output circuit comprises a first transistor, the first transistor has a gate, an input and an output, the gate of the first transistor is connected to a first node, the output of the first transistor is connected to the first scanning signal line for outputting the active potential to the first scanning signal line and the input is connected to the second clock signal line, and when the first node is the active potential, the first transistor outputs the second clock signal to the first scanning signal line,
    wherein the first output circuit further comprises a second transistor, the second transistor has a gate, an input and an output, the output of the second transistor is connected to the first scanning signal line for outputting the non-active potential to the first scanning signal line and the input of the second transistor is connected to a non-active potential line, and when the fourth clock signal becomes the active potential, the second transistor outputs the non-active potential to the first scanning signal line,
    wherein the first output circuit further comprises a third transistor, the third transistor has a gate, an input and an output, the output of the third transistor is connected to the gate of the second transistor, a clock signal of the fourth clock signal line is applied to the gate of the third transistor, and when the fourth clock signal becomes the active potential the third transistor outputs a voltage which is able to turn on the second transistor, and
    wherein the first output circuit further comprises a fourth transistor which outputs the non-active potential to the gate of the first transistor, a clock signal of the fourth clock signal line is applied to the gate of the fourth transistor, and when the fourth clock signal becomes the active potential, the fourth transistor outputs a voltage which is able to turn off the first transistor.

2. The display device according to claim 1, wherein the first output circuit further comprises a first reset transistor,
    wherein the first reset transistor connects between the gate of the first transistor and the non-active potential line,
    wherein the first reset transistor provides the non-active potential to the gate of the first transistor when the fourth clock signal becomes the active potential.

3. The display device according to claim 1, wherein the first output circuit further comprises a second reset transistor,
    wherein the second reset transistor connects between the gate of the second transistor and the non-active potential line,
    wherein the second reset transistor provides the non-active potential to the gate of the second transistor when the first node becomes the active potential.

4. The display device according to claim 1, wherein the driving circuit further comprises a third output circuit configured to output the active potential to the third scanning signal line,
    wherein the third output circuit comprises a first transistor, the first transistor of the third output circuit has a gate, an output and an input, the gate of the first transistor of the third output circuit is connected to a first node of the third output circuit, the output of the first transistor of the third output circuit is connected to the third scanning signal line for outputting the active potential to the third scanning signal line and the input is connected to the fourth clock signal line, and when the first node of the third output circuit is the active potential, the first transistor of the third output circuit outputs the fourth clock signal to the third scanning signal line.

5. The display device according to claim 1, wherein the driving circuit further comprises a second output circuit configured to output the active potential to the second scanning signal line,
wherein the driving circuit further comprises a third output circuit configured to output the active potential to the third scanning signal line,
wherein the second output circuit applies the active potential to the first node of the first output circuit and the first node of the third output circuit.

6. A display device comprising:
a plurality of pixels including a pixel transistor respectively,
a plurality of scanning signal lines supplying a scanning signal to the plurality of pixels respectively,
a driving circuit sequentially applying the scanning signal to the plurality of scanning lines, and
four clock signal lines including a first clock signal line, a second clock signal line, a third clock signal line and a fourth clock signal line,
wherein the scanning signal has an active potential which is able to turn on a pixel transistor and a non-active potential which is able to turn off the pixel transistor,
wherein the plurality of scanning signal lines are arranged in order of a first scanning signal line, a second scanning signal line and a third scanning signal line,
wherein the driving circuit comprises a first output circuit configured to output the active potential to the first scanning signal line and a third output circuit configured to output the active potential to the third scanning signal line,
wherein, four clock signal lines become the active potential in order of the first clock signal line, the second clock signal line, the third clock signal line and the fourth clock signal line,
wherein each of the first output circuit and the third output circuit comprises a first transistor and a first node, each of the first transistor having a gate, an input terminal and an output terminal, the gate of each of the first transistors being connected to the first node of the respective output circuit,
wherein the output terminal of the first transistor of the first output circuit is connected to the first scanning signal line for outputting the active potential to the first scanning signal line and the input terminal is connected to the second clock signal line, and when the first node of the first output circuit is the active potential, the first transistor of the first output circuit outputs the second clock signal to the first scanning signal line,
wherein the output terminal of the first transistor of the third output circuit is connected to the third scanning signal line for outputting the active potential to the third scanning signal line and the input terminal is connected to the fourth clock signal line, and when the first node of the third output circuit is the active potential, the first transistor of the third output circuit outputs the fourth clock signal to the first scanning signal line,
wherein each of the first output circuit and the third output circuit further comprise a second transistor,
wherein the second transistor has a gate, an input terminal and an output terminal,
wherein the gate of the second transistor of the first output circuit is connected to the fourth clock signal line by a third transistor, the output terminal of the second transistor of the first output circuit is connected to the first scanning signal line for outputting the non-active potential to the first scanning signal line and the input terminal is connected to a non-active potential line, and when the fourth clock signal becomes the active potential, the second transistor of the first output circuit outputs the non-active potential to the first scanning signal line,
the third transistor has a gate to which is applied a clock signal of the fourth clock signal line, and when the fourth clock signal becomes the active potential, the third transistor outputs a voltage which is able to turn on the second transistor of the first output circuit, and
wherein the first output circuit further comprises a fourth transistor which outputs the non-active potential to the gate of the first transistor of the first output circuit, a clock signal of the fourth clock signal line is applied to the gate of the fourth transistor, and when the fourth clock signal becomes the active potential the fourth transistor outputs a voltage which is able to turn off the first transistor.

7. The display device according to claim 6,
wherein each of the first output circuit and the third output circuit further comprises a first reset transistor, the first reset transistor of the first output circuit provides the non-active potential to the gate of the first transistor of the first output circuit when the fourth clock signal becomes the active potential, the first reset transistor of the third output circuit provides the non-active potential to the gate of the first transistor of the third output circuit when the second clock signal becomes the active potential, and
wherein the first output circuit has the fourth clock signal applied to a gate of the first reset transistor of the first output circuit, and the third output circuit has the second clock signal applied to a gate of the first reset transistor of the third output circuit.

8. The display device according to claim 6, wherein the first output circuit further comprises a second reset transistor,
wherein the second reset transistor of the first output circuit connects between the gate of the second transistor of the first output circuit and the non-active potential line,
the second reset transistor of the first output circuit provides the non-active potential to the gate of the second transistor of the first output circuit when the first node of the first output circuit becomes the active potential.

9. The display device according to claim 6,
wherein the driving circuit further comprises a second output circuit configured to output the active potential to the second scanning signal line,
wherein the second output circuit applies the active potential to the first node of the first output circuit and the first node of the third output circuit.

* * * * *